United States Patent [19]

Fukasawa et al.

[11] Patent Number: 4,701,923
[45] Date of Patent: Oct. 20, 1987

[54] ADAPTIVELY CODED DATA COMMUNICATION SYSTEM WITH HALF DUPLEX AND/OR FULL DUPLEX FUNCTION

[75] Inventors: Atsushi Fukasawa; Takuro Sato; Haruhiko Akiyama; Manabu Kawabe, all of Tokyo, Japan

[73] Assignee: Oki Electric Industry Co., Ltd., Tokyo, Japan

[21] Appl. No.: 818,825

[22] Filed: Jan. 14, 1986

[30] Foreign Application Priority Data

Jan. 14, 1985 [JP] Japan ................................. 60-3381
Jan. 17, 1985 [JP] Japan ................................. 60-5009

[51] Int. Cl.$^4$ ............................................. G06F 11/00
[52] U.S. Cl. ......................................... 371/41; 371/37
[58] Field of Search ............................. 371/41, 42, 69; 375/104, 108, 114, 116; 358/314

[56] References Cited

U.S. PATENT DOCUMENTS 3,078,443 2/1963 Rose ..................................... 371/41
3,372,376 10/1968 Helm .................................... 371/41
3,506,961 4/1970 Abramson ............................ 371/41

FOREIGN PATENT DOCUMENTS 0090552 7/1973 Canada ................................. 371/41
0544152 4/1977 U.S.S.R. ............................... 371/41

OTHER PUBLICATIONS

"Error Correction Coding Starting To Be Extensively put into Practice in Various Fields", by Tanaka, Nikkei Electronics, 1975, 12 to 15, pp. 48–52.

Primary Examiner—Michael R. Fleming
Attorney, Agent, or Firm—Wenderoth, Lind & Ponack

[57] ABSTRACT

An error correcting encoding method and a vehicle data communication apparatus based on the same for use in data communication via fading communication channels dominated by burst errors in the data communication among vehicles such as automobiles are disclosed. The error correction encoding method detects, as data sent from a transmitting side is received by a receiving side, any error contained in the received data as a frame error rate of error frames involved in block data or a bit error rate of error bits involved in the block data and selects an error correcting code in response to the frame error rate for encoding. The vehicle data communication apparatus according to the present invention profitably employs the method, and changes an error correcting code to be used on the transmitting side in response to the extent of errors involved in the received data detected by the receiving side of a remote apparatus.

1 Claim, 9 Drawing Figures

ADAPTIVELY CODED DATA COMMUNICATION SYSTEM WITH HALF DUPLEX AND/OR FULL DUPLEX FUNCTION

BACKGROUND OF THE INVENTION

1. Field of the Invention

The present invention relates to an error correction encoding system for use in effecting data communication via a fading channel dominated by burst errors in communication among vehicles such as automobiles, etc.

2. Description of the Prior Art

"Error correcting code" to automatically correct digital information is indispensable nowadays to improve reliability of computers and data communication systems. Two types of error encoding systems are known for the error correcting codes. One is suited to random error correction, and the other to burst error correction depending on error patterns to be corrected. In particular, in extremely bad-conditioned channels such for example as fading channels in communication among vehicles such as automobiles, the burst error is dominant. For a system to correct the burst error, an intereleaving system is known as described in "Error Correction Coding Starting to Be Extensively Put into Practice in Various Fields" by Tanaka, Nikkei Electronics, 1975, 12 to 15, pp 48 to 52. This interleaves the burst error, and thereby converts it to a random error which can be then satisfactorily processed with use of proper random error correcting codes. However, the system can not be applied to systems requiring a severe delay time characteristic since the sytem delays in its decoding.

In addition, another error correction system such an automatic repeat request method as being described in Malcolm C. Easton "Bath Throuput Efficiency of ADCCP/HDLC/SDLC Selective Reject Protcols" 1980, TEEE, PP 187 to 195 is known.

Both systems are greatly varied in the burst length because of in a mobile radio, great changes of a vehicle speed ranging from zero to one hundred and several tens of kilometers per hour as well as of a signal reception level ranging from about minus 100 dB to minus several tens of dB. Accordingly, several hundred bits of interleave are needed to randomize a signal with use thereof, whereby more delay time is required. Thus, larger capacity memory of a RAM is needed and further throughput efficiency is deteriorated. In addition, to securely effect communication only with an error correcting code having a burst length of several bits, throughput efficiency is sharply deteriorated.

SUMMARY OF THE INVENTION

It is an object of the present invention to provide an excellent error correction encoding system capable of data communication with less deteriorated throughput efficiency even if a vehicle changes in its speed from zero to one hundred and several tens of km/h as well as in a signal reception level from a lower one to several tens of dB.

According to the present invention, in receiving any data sent from a transmitting side to a receiving side, an error involved in the received data is detected as a frame error rate in a block or a bit error rate in the block and an error correcting code is selected in response to the extent of the error rate for encoding and decoding the transmission data.

An error correction encoding system for vehicle data communication according to the present invention supervises an error rate of data received by a receiver, whereby an error correcting code is adaptively changed for transmitting and receiving the data, and comprises the steps of: (a) transmitting data provided by encoding transmission data with use of a designated error correcting code to a transmission channel, (b) decoding the data received from the communication channel with use of the same error correcting code as that of the transmitting side and thereby detecting the erroneous information involved in the received data, (c) receiving the erroneous information from the receiving side and adaptively selecting the error correcting code, and (d) retransmitting the erroneous data with use of the selected error correcting code, while designating the error correcting code as the error correcting code for use in the step of (a).

The erroneous information detected by the method includes an error frame number to the whole frame number contained in the received one block data, i.e., a frame error rate and a bit error rate of the received one block data.

In addition, the vehicle data communication apparatus according to the present invention profitably employing the error correction encoding method, in which an error correcting code is changed based on the received data error rate for transmission and reception, comprises (1) a transmitting side including: (a) an error correcting code memory unit for storing a plurality of error correcting codes, (b) a receiver for receiving error information carried by reception data transmitted from a receiving side of a remote apparatus, (c) a decoder for decoding an output issued from the receiver, (d) an encoder for taking out an adaptive error correcting code from the error correcting code memory unit based on error information being an output from the decoder, whereby encoding data delivered from a transmitting terminal unit, and (c) a transmitter for transmitting the encoded data to a communication channel, and comprises (2) a receiving side including: (a) a receiver for receiving data transmitted from a transmitting side of a remote apparatus, (b) a decoder for decoding an output from the receiver with use of the same error correcting code as that of the transmitting side and transferring it to a receiving terminal unit, while detecting error contained in the received data, (c) an encoder for encoding error information delivered from the decoder, and (d) a transmitter for transmitting an output from the encoder to the transmitting side of the remote apparatus. The vehicle communication apparatus according to the present invention includes two systems, namely, one of them encodes data in the encoder for every frame units, and puts together a plurality of the encoded frames into one block, while in the receiving side, detects error contained in the received data for every frame units as a rate of error frames to the whole frames contained in on transmitted block, i.e., a frame error rate, and selects an error correcting code base on the frame error rate, while the other system, in the receiving side, estimates a bit error rate per received block and selects an error correcting code based on the estimated bit error rate.

The above and other objects, features and advantages of the present invention will become more apparent from the following description when taken in conjunction with an illustrative examples.

DESCRIPTION OF THE PREFERRED EMBODIMENT

Figure 1:
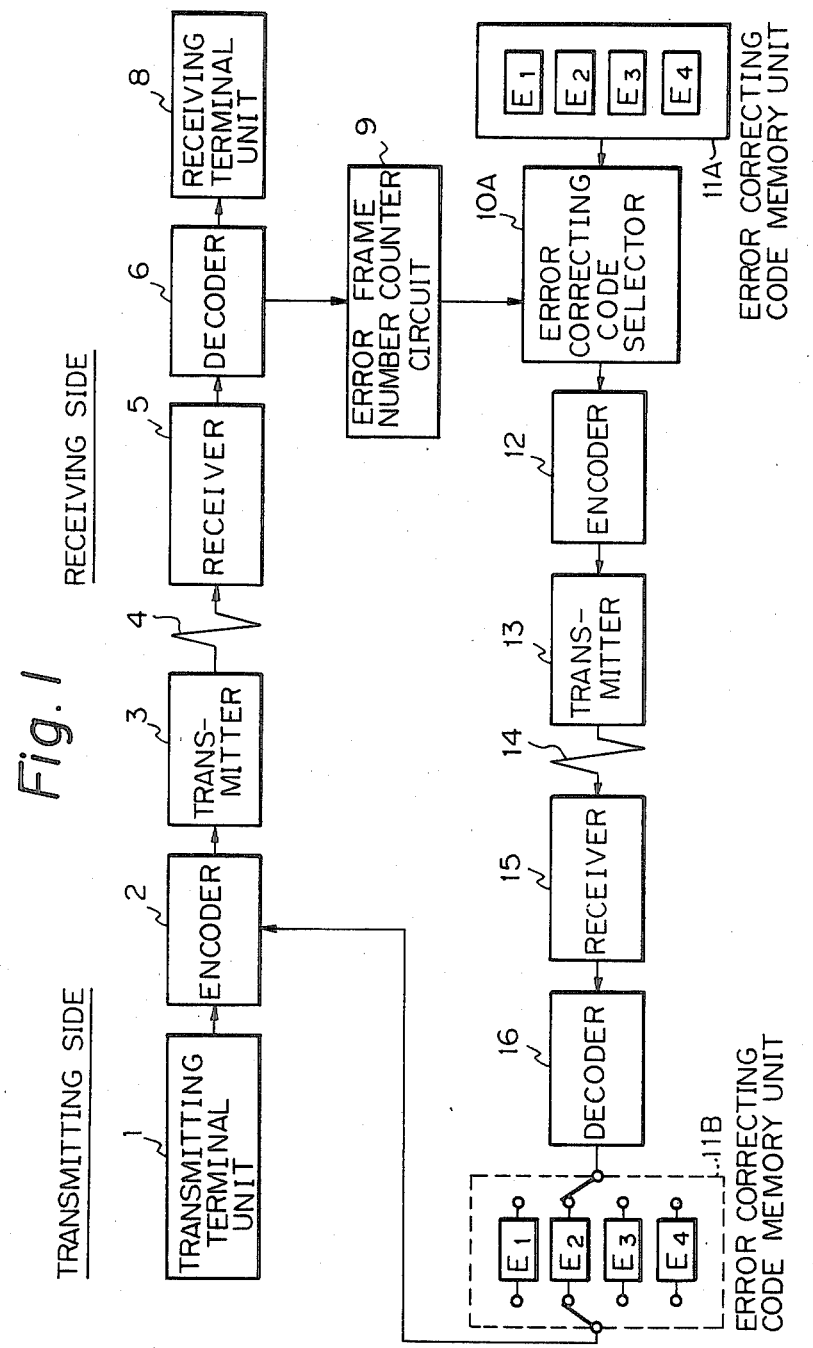
FIG. 1 is a block diagram illustrating a first embodiment of an error correction encoding system according to the present invention.

As shown in FIG. 1, the first embodiment of the error correction encoding system according to the present invention detects error frames contained in data received by a receiving side, selects an error correcting code corresponding to a number of error frames contained in block data, and signalling it to a transmitting side, while on the transmitting side, encodes the data with use of the selected error correcting code and transmits it.

Figure 2:
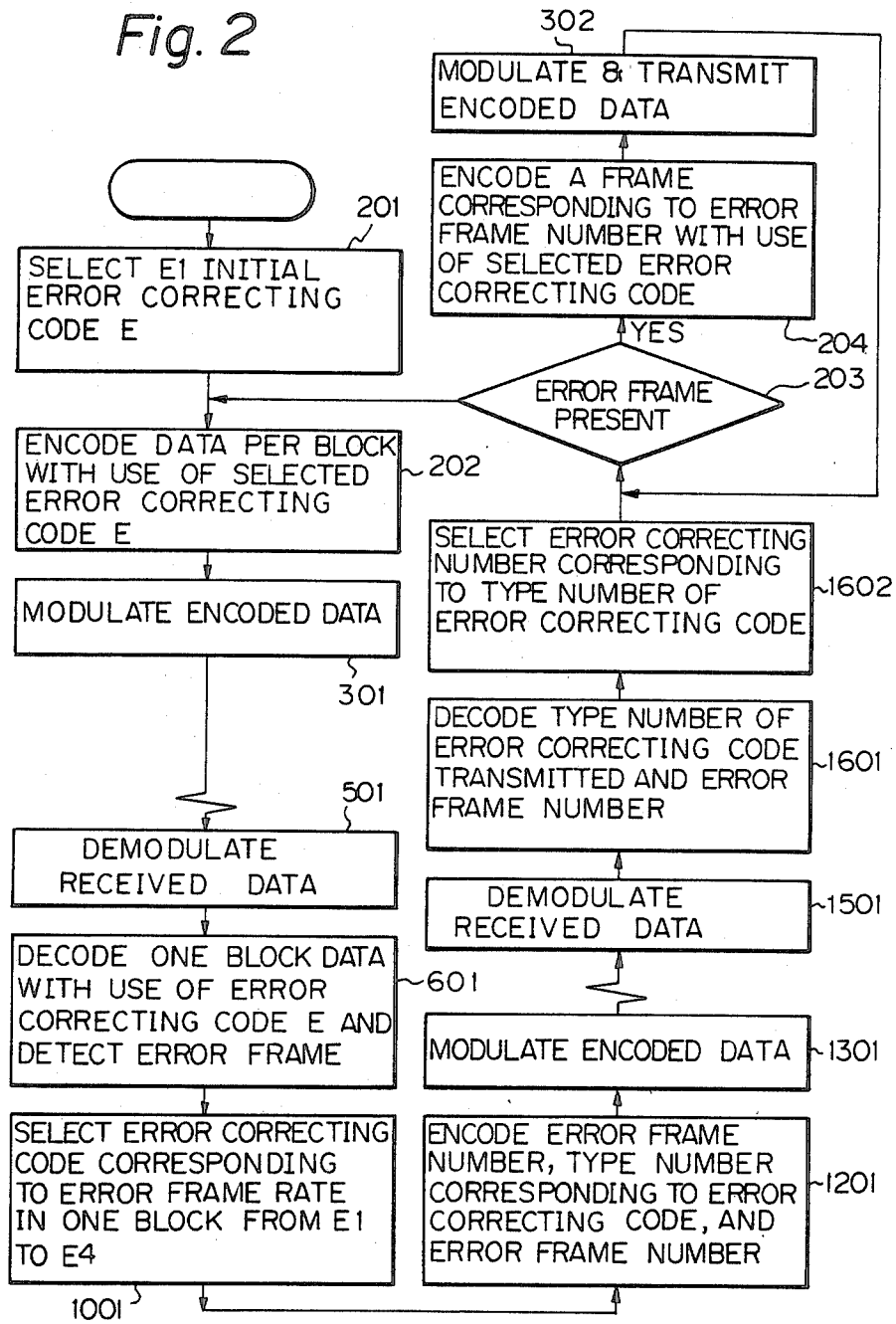
FIG. 2 is a flowchart illustrating operation of the error correction encoding system of FIG. 1.

Designated at 1 is a transmitting terminal unit, 2 is an encoder, 3 is a transmitter, 4 is a channel, 5 is a receiver, 6 is a decoder, 8 is a receiving terminal unit, 9 is an error frame number counter circuit, 10A is an error correcting code selector, 11A is an error correcting code counter circuit, 12 is an encoder, 13 is a transmitter, 14 is a channel, 15 is a receiver, 16 is a decoder, and 11B is an error correcting code memory unit. Referring to FIG. 2, operation of the error correction encoding system of FIG. 1 will be described below. Transmission data is delivered from the transmitting terminal unit 1 to the encoder 2. Four kinds of error correcting codes used in the encoder 2 are known as E1, E2, E3 and E4, and E1 is used in initial setting for encoding (FIG. 2, box 201). The encoder 2 gives a number to each frame with use of the correcting code E1, and encodes it. The encoder puts together a plurality of the frames into a block to provide encoded data (FIG. 2, box 202). The encoded data is modulated in the transmitter 3 and delivered to the channel 4 (FIG. 2, box 301). The channel 4 is subjected to fading, and produces burst errors in the modulated signal as a vehicle runs, which is received by the receiving side. The receiving side demodulates the received encoded data in the receiver 5 (FIG. 2, box 501). In succession, the decoder 6 decodes an output from the receiver 5 for each frame corresponding to the error correcting code E1 used in the encoder 2, while detects error frames by means of an error detecting method based on a cyclic code (FIG. 2, box 601). The decoded data is supplied to the receiving terminal unit 8, while the error frame number counter circuit 9 evaluates a rate of an error frame number to all frames contained in a transmitted data block. The error correcting code memory unit 11A stores therein numbers corresponding to the error correcting codes E1 to E4. The error correcting code selector 10A selects a number indicative of a type of the error correcting code from the error correcting code memory unit 11A corresponding to the error rate of the frames contained in the one block data just received. The type number of the error correcting code selected by the error correcting code selector 10A and the number of the error frame are encoded through the encoder 12 and transferred to the transmitter 13 (FIG. 2, box 1201). The encoder 12 encodes the data transferred in conformity with the predetermined encoding system. The signal modulated by the transmitter 13 is delivered to the transmitting side via the channel 14 (FIG. 2, box 1301). The receiver 15, on the receiving side, demodulates the received modulated data, and delivers it to the decoder 16 (FIG. 2, box 1501). The decoder 16 decodes the type number of the error correcting code and the number of the error frame of the error correcting code supplied from the receiving side (FIG. 2, box 1601). When the decoder 16 detects any error, it requests the receiving side to again transmit the same data to the transmitting side. But, the description is omitted here. In addition, the decoder 16 takes out the error correcting code from the error correcting code memory unit 11B based on the type number of the received correcting code, and transfers it to the encoder 2 (FIG. 2, box 1602). The encoder 2 again transmits the frame data including the frame number received in error to the receiving side via the transmitter 3 with use of the selected error correcting code. Provided that a plurality of the error frames are detected, all the frames are likewise transmitted to the receiving side (FIG. 2, boxes 203, 204, 302). The next data from the transmitting terminal unit 1 is transmitted to the receiving side in the same procedure with use of the error correcting code selected by the error correcting code memory unit 11B. With the present embodiment of the encoding system for error correction, the error correcting code which the encoder 2 on the transmitting side uses is selected in response to the error rate of the frames within the received data block on the receiving side, and encoded for communication, whereby an encoding system for error correction adapted to communication conditions of the fading channel is provided.

Figure 3:
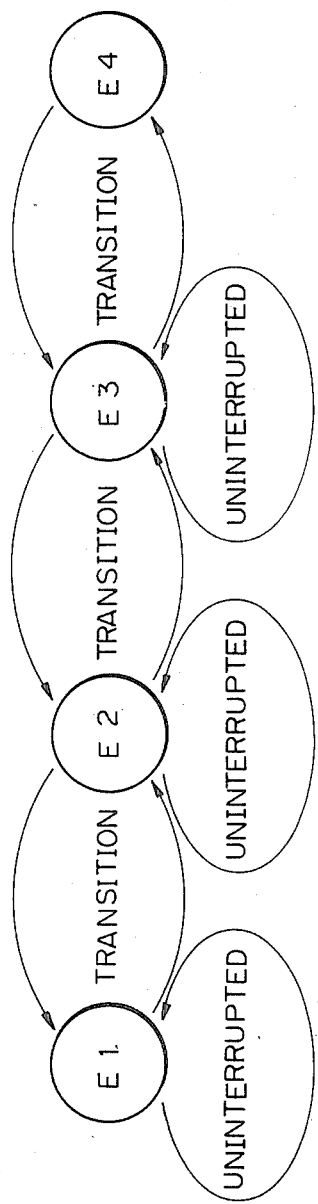
FIG. 3 is a schematic showing transitions among respective steps of from E1 to E4 of error correcting codes.

FIG. 3 illustrates transistions among the error correcting codes E1 to E4. The error correcting code E1 is one taking nk bits (n a positive integer) as one block when a bit number possessed by one frame is made k bits (e.g., 1024 bits), having no error correcting bit but only a parity check bit for error detection. The error correcting code E2 takes k bits as one block when a bit number possessed by one frame is made k bits, having no bit for error correction but only a parity check bit. The error correcting code E3 takes k bits as one block similarly as before, and has an error correcting code with an information rate of $\frac{1}{2}$. The error correcting code E4 takes k bits as one block and has an error correcting code and a parity check bit. The code further securely transmits data even if an encoding rate is deteriorated to a fraction of several parts by making use of a decoding technique with decision by majority.

The error correcting codes E1 to E4 are previously stored in the error correcting code memory unit 11B, and selected in response to conditions of a concerning circuit. Namely, when an error produced on the channel 4 has been corrected by making use of the error correcting code E2, provided that conditions of the channel 4 and a speed of an automobile, etc., are kept substantially constant, the error correcting code E2 is not changed, and communication runs with use of the code.

With the conditions of the channel 4 bad conditioned, error bits are increased, and the state of the encoding system for error correction changes to a state with the error correcting code E3 base on information available from the receiving side.

Contrary, with the channel 4 better-conditioned, the state changes to a state with the error correcting code E1 based on information from the receiving side.

Figure 4:
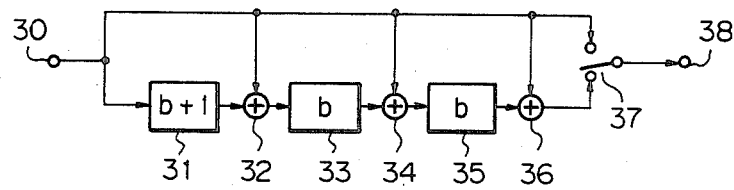
FIG. 4 is a block diagram of an encoder 2 shown in FIG. 1.

The encoder 2 shown in FIG. 1 is one with use of a diffusion code, and comprises a circuit shown in FIG. 4. It is known that the encoder has in general shift registers and exclusive ORs (mode 2). The circuit of the encoder 2 is uniquely defined as given a generator polynomial. Therefore, with the above diffusion code, the encoder 2 is constructed as shown in FIG. 4. Designated at 30 is an encoding part input terminal, 31 is a b+1 stage shift register, 33 and 35 are b stage shift register, respectively, 32, 34, and 36 are exclusive ORs, respectively, 37 is an information/check changeover switch, and 38 is an encoding part output terminal. An information bit supplied to the encoding part input terminal 30 is provided to the information/check changeover switch, while provided to an input of the b+1 stage shift register 31. Thereafter, the information bits are delayed through the respective exclusive ORs and b stage shift registers, and finally a check bit is delivered from an output of the exclusive-OR 36. These information and check bits are alternately sent to the encoding part output terminal 38 with the aid of the information/check changeover switch 27, and transmitted to the transmitter 3.

Figure 5:
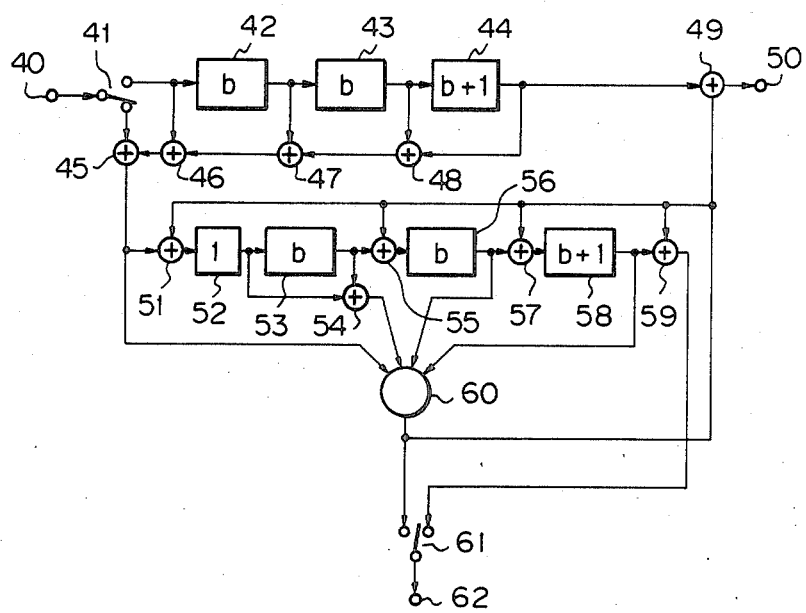
FIG. 5 is a block diagram of a decoder 6 of FIG. 1.

In addition, the decoder 6 shown in FIG. 1 comprises a circuit shown in FIG. 5. The decoder 6 of FIG. 5 is on with use of a diffusion code, and effects majority logic decoding of a convolutional code. In FIG. 5, designated at 42 and 43 are a b stage shift register, respectively, 44 a b+1 stage shift register, and 45 to 49 an exclusive OR, respectively. An information bit is supplied to the b stage shift register 42 via the information/check changeover switch serving to alternately switch the information bit and the check bit, and delayed via the b stage shift register 43 and the b+1 stage shift register 44. In addition, a check bit yielded on the basis of an information bit received from the output of the exclusive OR 46 is delivered.

The check bit and a check bit supplied via the information check changeover switch 41 are exclusive OR'ed by the exclusive OR circuit 45. An output of the exclusive OR 45 is supplied to the exclusive OR 51 on one side, and error detection is effected by the exclusive ORs 51, 54, 55, 57, and 59, a single-stage shift register 52, the b stage shift registers 53, 56, the b+1 stage shift register 58, and a majority element 60. As a result of it, an error detector signal for the information bit is available from an output of the majority element 60, while an error detection signal for the check bit available from the output of the exclusive OR 59. The output from the majority element 60 is supplied to the exclusive OR 49, whereby an erroneous information bit supplied from the b+1 stage shift register 44 is corrected, and a data output signal is delivered to the receiving terminal unit 8 via the data output terminal 50 of the decoder, while the above output from the majority element 60 is suplied to the information/check changeover switch 61. Further, the output from the exclusive OR 59 is delivered to the information/check switch 61. The information/check changeover switch 61 alternately switches between the error detection signal for the information bit and the error detection signal for the check bit, and delivers them. As a result of it, the error detection signal is supplied to an error frame number counter circuit 9 via an error detection signal output terminal 62.

A second embodiment of the error correction encoding system according to the present invention will be described with reference to FIG. 6.

The embodiment detects on the receiving side a number of error frames contained in a received data block of data transmitted from the transmitting side, and selects an error correcting code based on a frame error rate. The present embodiment is of the same as the first embodiment described before with the exception of a fact that it has not the error correcting code selector and the error correcting code memory unit on the receiving side but having the former only on the transmitting side.

Figure 6:
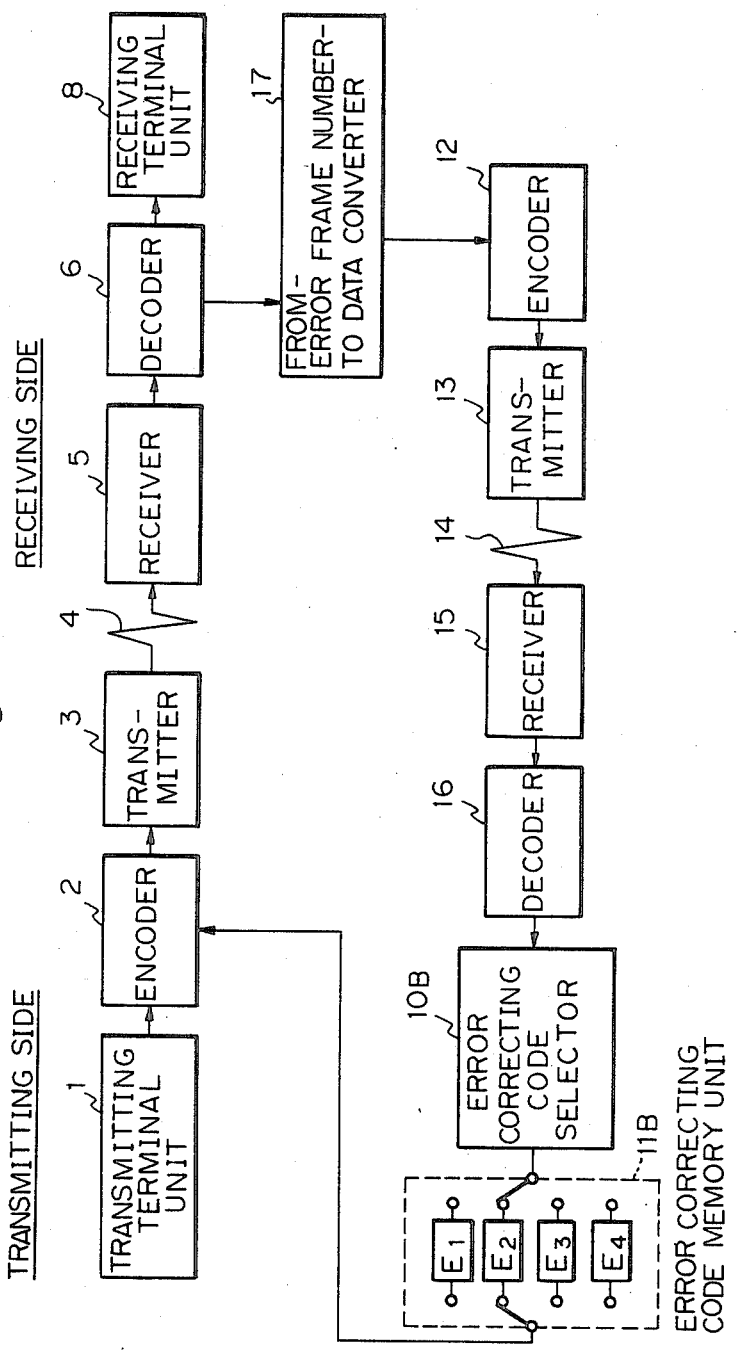
FIG. 6 is a block diagram illustrating a second embodiment of the error correction encoding system according to the present invention.

In FIG. 6, designated at 10B is the error correcting code selector, 17 is a unit for preparing data from an error frame number. Other symbols in the same figure are the same as those shown in FIG. 1. Transmission data transmitted from the transmitting terminal unit 1 is encoded for each frame unit by the encoder 2 with use of the error correcting code E1 in the same way as in FIG. 1, and numbers are assigned to every frames. In addition, a plurality of the frames are brought together into a block, modulated through the transmitter 3, and delivered to the channel. The receiving side demodulates the received encoded data by making use of the receiver 5, and thereafter the data is decoded by the decoder 6. The decoder 6 decodes the data for every frames as in FIG. 1, detects an erroneous frame, and prepares data from an error frame number in the data preparation unit 17. Then, the error frame number data is encoded in the encoder 12 using a predetermined encoding system, modulated through the transmitter 13, and delivered to the transmitting side. The transmitting side receives the transmitted data, demodulates through the demodulator 15, and decodes by the decoder 16. In succession, the error correcting code selector 10B estimates a ratio of an error frame number to a number of all frames within one data block transmitted previously, selects the next error correcting code from the E1 to E4 stored in the error correcting code memory unit 11B corresponding to the error frame rate, and provides it to the encoder 2. All the error frames are encoded with use of a newly selected error correcting code, modulated in the transmitter 3, and retransmitted to the receiving side also together with a type of the newly selected error correcting code. Although the next block data is also encoded with the newly selected error correcting code, the error correcting code is changed thereafter corresponding to error frames for every blocks. Moreover, the error correcting codes E1 to E4 for use in the present embodiment are the same as those described in FIG. 3. As described above, the present embodiment also effects the error correcting encoding adapted to communication conditions of a fading channel.

Although the above two embodiments is described about a half duplex method. This error correcting method can be adapted for full duplex method. This full duplex method can be realized by having the functioning circuits between the transmitting equipment and receiving equipment as shown in FIG. 1.

Schema of the full duplex equipment is as follows: Terminal unit is connected with encoder and decoder. Transmitter has the switch between encoder with error correcting code memory unit and encoder with error correcting code selector. Receiver has the switch between decoder with error correcting code memory unit and decoder with error flame numbers counter unit.

Figure 7:
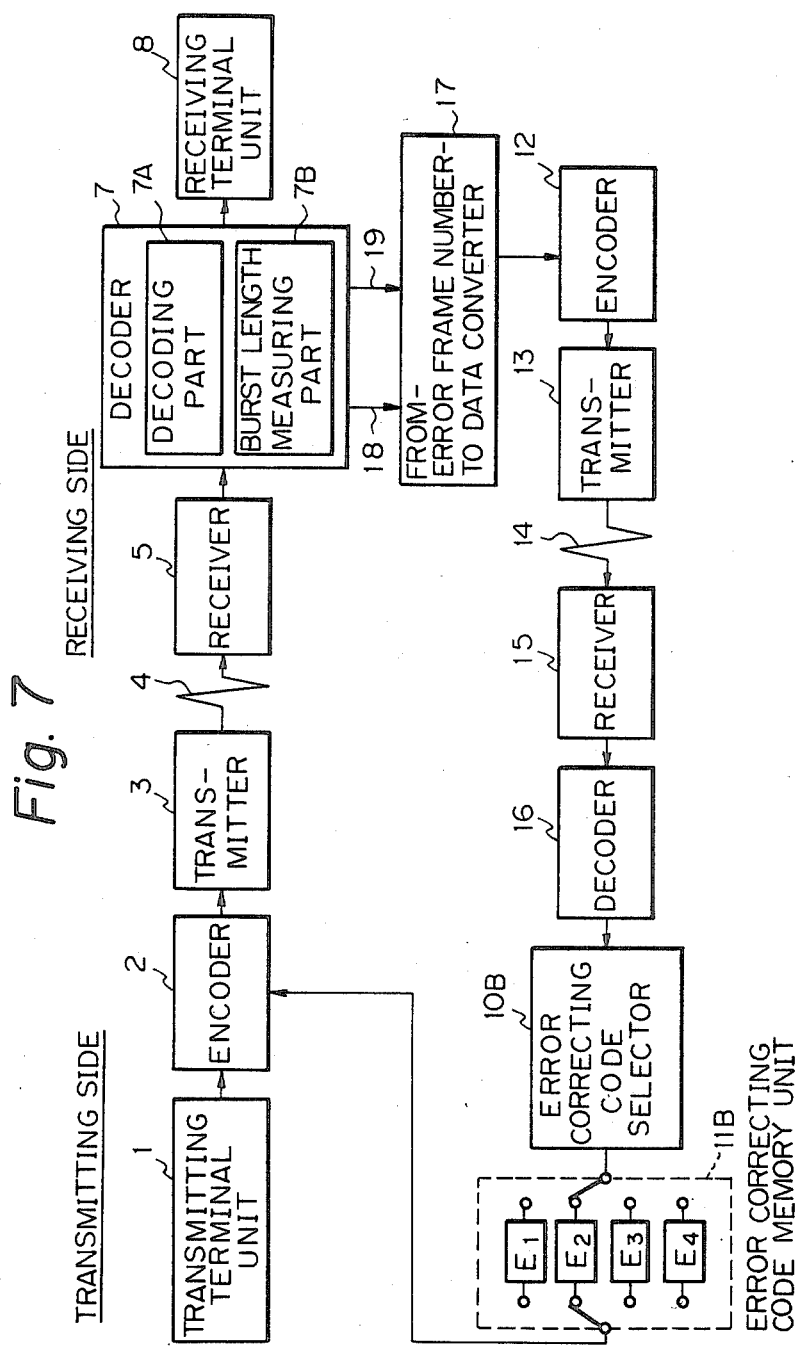
FIG. 7 is a block diagram illustrating a third embodiment of the error correction encoding system according to the present invention.
Figure 8:
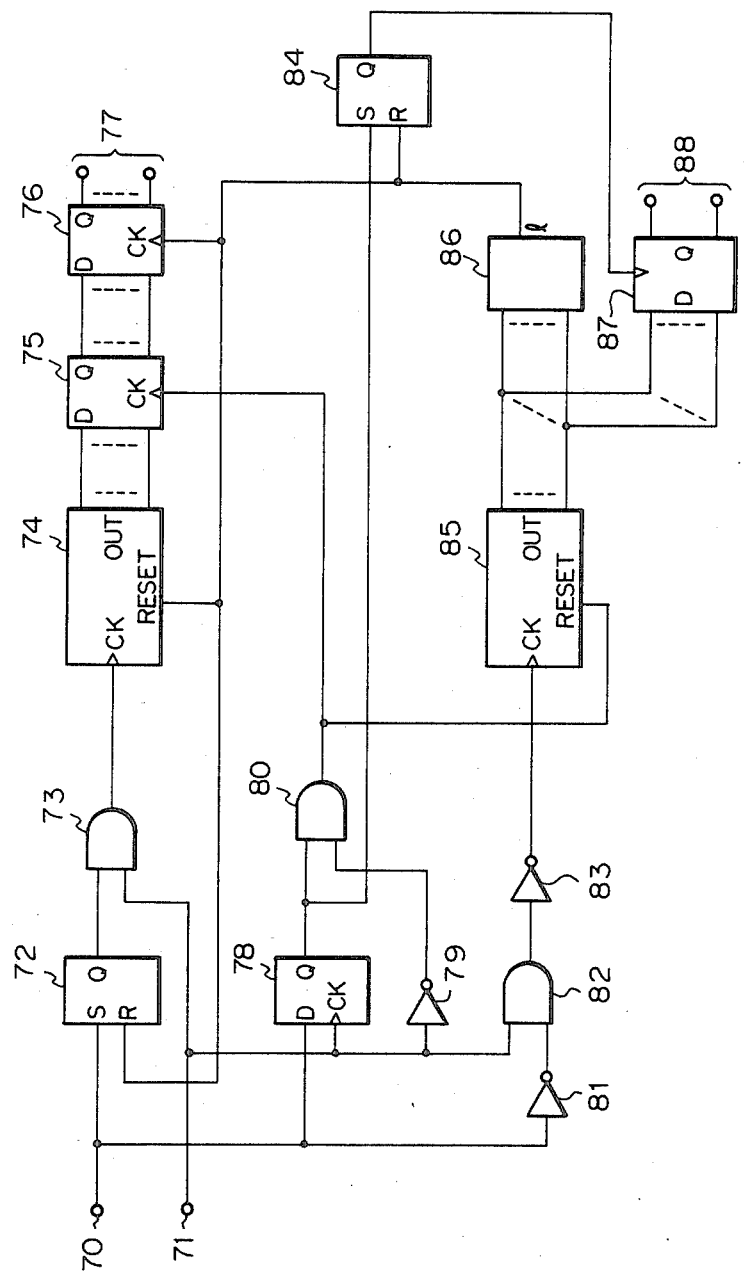
FIG. 8 is a circuit block diagram of a burst length measuring part 7B.

Referring to FIG. 7, a third embodiment according to the present invention will be described. Although the above two embodiments change an error correcting code in response to an error rate of frames contained in a data block, the present embodiment estimates a bit error rate of received data for every frames, compares the estimated one with a circuit error rate being a defined transmission quality for thereby deciding whether the former is of an error frame or met for every frames and changes the error correcting code in conformity with a rate of error frames contained in a data block.

Designated at 7 is a decoder, 7A is a decoding part, and a burst length measuring part. Other symbols are the same as those in FIG. 6. Transmission data from the transmitting terminal unit 1 is supplied to the encoder 2. The encoder 2 encodes the transmission data for each frame unit using the error correcting code E1 subjected to initial set, assigns frame numbers to every frames, and brings them together into a block. The present invention employs a convolution code as an error correcting code. Subsequently, the resultant data block is modulated in the transmitter 3, and delivered to the channel 4. Then, data indicative of a type of the error correcting code is also delivered. The encoded data received by the receiving side is demodulated by the receiver 5, and thereafter decoded through the decoder 7. The decoding part 7A decodes the data with use of a previously selected error correcting code, and delivers normal data to the receiving terminal unit 8. Then, the burst length measuring part 7B, after receiving an error detection signal delivered from the decoding part 7A, measures a length of the burst error as well as a length of an error-free interval for each frame, and converts them into a channel bit error rate. The burst length measuring part 7B, for example, when the transmission quality is desired to be less than $10^{-6}$ in a channel error rate, decides a measured frame to be proper provided that a channel error rate thereof is less than $10^{-6}$, while decides it to be improper provided that the above rate less than $10^{-6}$. Then, the from-error frame number to data converting unit 17 converts a number of a frame decided to be erroneous to data, and the encoder 12 encoders the resultant data and delivers it to the transmitter 13. In this case, the encoder 12 does the same in conformity with a predetermined encoding system. The encoded data is modulated through the transmitter 13, and transmitted to the channel 14. The transmitting side demodulates the received modulated data in the receiver 15, and decodes the encoded data in the decoder 16 corresponding to the encoder 12 for detecting an error frame number. Provided that any error is present in the decoded data, the transmitting side requests for the receiving side to again transmit the same data. The details thereabout will be emitted here. In succession, the error correcting code selector 10B estimates a ratio of the error frames to the total bits number of the frames transmitted in the last time, and selects an error correcting code corresponding to the ratio from the error correcting code memory unit 11B. The selection is the same as described in FIG. 3. All frames corresponding to frame numbers received side are encoded with use of the selected error correcting code and retransmitted to the receiving side via the modulator 3. Then, a type of the newly selected error correcting code is also transmitted from the transmitting side to the receiving side. Hereby, the decoding part 7A on the receiving side is made possible to effect decoding corresponding to the encoder 2. Although the next clock data from the tranmitting terminal unit 1 is also encoded using the newly selected error correcting code as it is, error correcting codes are thereafter altered corresponding to bit error rates for every blocks.

Figure 9:
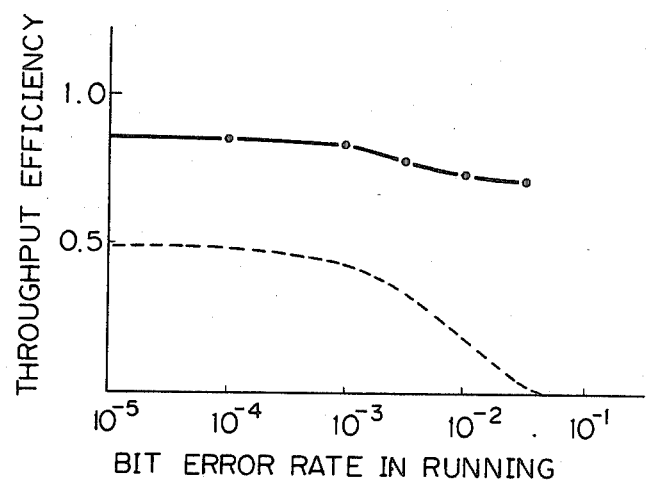
FIG. 9 is a schematic illustrating throughput efficiency in the embodiments of the error correction encoding system according to the present invention.

The burst length measuring part 7B comprises a circuit shown in FIG. 9, and determines a length of an burst error and a length of an error-free interval based on an error detection signal from the decoding part 7A. In the same figure, designated at 70 is an error detection signal input terminal, 71 is a reception clock terminals, 72 and 84 are flip-flops, 74 and 85 are input counter, 75, 76, 78 and 87 are latches, 77 is a burst error length output terminal, 86 is a decoder, 88 is an error free interval output terminal, 73, 80 and 82 are AND gates, and 79, 81 and 83 are inverters. With a burst error existing on the channel 4, the flip-flop 72 is set by a first error involved in an error detection signal supplied from the decoding part 7A via the error detection signal input terminal 70, and an output thereof is supplied to the counter 74 via the AND gate 73. The counter 74 starts to count the burst error length. An output from the counter 74 is held in the latch 75 every time a burst error is produced. By contrast, without any burst error, a clock is provided to the counter 85 via the AND gate 82 and the inverter 83. The counter 85 is counting a length of data having no burst error. Reached a counted value by the counter 85 to a burst limit 1, the limit is detected by the decoder 86. As a result of it, an output of the decoder 86 is provided to a clock input of the latch 76, and the length of the burst error is delivered from the latch 76. The output from the decoder 86 is further provided to reset terminals (RESET) of the flip-flop 72 and the counter 74 to reset them. The length of the error free interval counted by the counter 85 is delivered from the latch 87 by a signal provided through the latch 78 and the flip-flop 84 due to a burst error produced in the next time. Thus, the burst error length and the error-free interval are issued respectively via the burst error length output terminal 77 and the error free interval output terminal 88 located in the burst length measuring part, and finally outputted to the outside via the burst length output terminal 18 and the error-free length output terminal 19 shown in FIG. 7.

Then a fourth embodiment of the present invention will be described.

The present invention estimates a bit error rate of the whole of one block data received on the receiving side, and selects an error correcting code in response to the estimated bit error rate, while compares the bit error rate with a channel error rate being specified transmission quality, for thereby deciding the received block data to be proper block data provided that a bit error rate of the received block data is less than the specified channel error rate, while decides it to be improper if more than the specified channel error rate, and as a result of it it encodes the resulting data with use of the selected error correcting code for retransmission.

Namely, the receiving side estimates the bit error rate of the whole of the one block data with use of the output from the burst length measuring part 7B of FIG. 7, compares the bit error rate with a specified channel error rate, and if improper, requests the transmitting side to retransmit the block data. Simultaneously, the error correction encoding system transmits the bit error rate estimated thereby, and selects an optimum error correcting code from the error correcting code memory unit base on the bit error rate, and furthermore encodes error block data as well as the succeeding data with use of the selected error correcting code and transmits them. Thereafter, the error correcting code is altered corresponding to bit error rates for every blocks.

Referring to FIG. 9, a throughput efficiency with respect to the bit error rate will be described. An automobile telephones and pocketable telephones relatively often communicate in their stopping. For brevity, such situation of the channel 412 is assumed that the automobile is at a stop and is running at a speed from 20 to 100 km/h.

It is further assumed that a time interval taken by the automobile in communication at a stop in $t_s$, and that in running $t_m$, and a ratio therebetween with respect to the whole transmission time is 7 to 3. Communication error rates at a stop and in running of the automobile are respectively assumed $P_s$ and $P_m$. According to experimental data, $P_s=0$ and $P_m=10^{-3}$. Under the conditions, the throughout efficiency can be approximated by (1).

$$\eta \approx \frac{t_s}{t_t} \frac{K_s}{N_s} (1 - P_s)N_s + \frac{t_m}{t_t} \frac{K_m}{N_m} (1 - P_m)N_m$$

Here, it is a total of the communication time and is equal to the sum of $t_s$ and $t_m$. $K_s/N_s$ and $K_m/N_m$ are respectively encoding rates of error correction. Since no error is produced at automobile stoppage, $K_s/N_s=1$, while since in its running error correction is manifested, $K_m/N_m=0.5$. $N_m$ is indicative of an information bit number and $K_m$ is a control bit number, and both are assumed to be 100 and 50 in order. A result estimated according to equation (1), i.e., a case according to the embodiment of the present invention are depicted by a solid line of FIG. 9(A), while a result evaluated when only a single error correcting code is applied with retransmission depicted by a broken line of FIG. 9(B). It is evidenced from the figure that the present invention sharply improves the throughput efficiency.

Although in vehicle communication radio channels are subjected to change of environment at all times due to the influence of fading, as described above, the present invention assures an extremely effective error correcting technique upon effecting data communication with use of channels located in strongly varying communication environments. It is anticipated that the throughput efficiency is improved because an optimum error correcting code is selected in conformity with conditions of a communication channel.

Although certain preferred embodiments have been shown and described, it should be understood that many changes and modifications may be made without departing from the scope of the appended claims.

We claim:

1. A adaptively coded data communication system with half duplex and/or full duplex function comprising a transmitting side unit and a receiving side unit;
   (1) said transmitting side unit including;
      (a) a source of input information data;
      (b) a means for providing encoding codes of different types with different redundancies;
      (c) a means for detecting a ratio of error frames to total frames according to error frame numbers transmitted from said receiving side unit, and for selecting one type of encoding code according to an initial state or said ratio of error frames;
      (d) a means for encoding said input information data and information data of said error frame numbers for each frame unit with a frame number, and for combining a plurality of frames together into a block with a number of said selected types of encoding codes; and
      (e) a transmitter for transmitting said encoded data to said receiving side unit;
   (2) a receiving side unit including;
      (a) a receiver for receiving data transmitted from said transmitting side unit;
      (b) a decoder for decoding an output from said receiver using said encoding code of said selected type number, and detecting frame numbers of error frames from decoded codes of said output from said receiver; and
      (c) a transmitter for transmitting said frame numbers of said error frames to said transmitting side unit.

* * * * *